(12) United States Patent
Zhou et al.

(10) Patent No.: US 12,035,471 B2
(45) Date of Patent: Jul. 9, 2024

(54) CIRCUIT STRUCTURE

(71) Applicant: GUANGZHOU LUXVISIONS INNOVATION TECHNOLOGY LIMITED, Guangzhou (CN)

(72) Inventors: Andu Zhou, Guangzhou (CN); Bingfeng Luo, Guangzhou (CN)

(73) Assignee: GUANGZHOU LUXVISIONS INNOVATION TECHNOLOGY LIMITED, Guangzhou (CN)

( * ) Notice: Subject to any disclaimer, the term of this patent is extended or adjusted under 35 U.S.C. 154(b) by 406 days.

(21) Appl. No.: 17/498,761

(22) Filed: Oct. 12, 2021

(65) Prior Publication Data

US 2022/0132662 A1   Apr. 28, 2022

(30) Foreign Application Priority Data

Oct. 28, 2020   (CN) .......................... 202011173690.2

(51) Int. Cl.
  *H01L 23/48* (2006.01)
  *H01L 23/00* (2006.01)
  (Continued)

(52) U.S. Cl.
  CPC .............. *H05K 1/111* (2013.01); *H01L 24/05* (2013.01); *H01L 24/06* (2013.01); *H01L 24/49* (2013.01);
  (Continued)

(58) Field of Classification Search
  CPC ......... H05K 1/111; H01L 24/05; H01L 24/06; H01L 24/49; H01L 2224/0603; H01L 2224/06132; H01L 2224/4903; H01L 2224/4911; H01L 2224/49175; H01L 2224/49421; H01L 2924/01029; H01L 2924/01079; H01L 2224/48091; H01L 2924/00014; H01L 24/48; H01L 2224/73265; H01L 2924/181; H01L 2224/48247; H01L 2224/48227;
  (Continued)

(56) References Cited

U.S. PATENT DOCUMENTS

| | | | | |
|---|---|---|---|---|
| 5,328,079 | A | * | 7/1994 | Mathew ................... H01L 24/48 228/180.5 |
| 2008/0029860 | A1 | * | 2/2008 | Gao ......................... H01L 24/49 257/E23.051 |
| 2008/0079173 | A1 | * | 4/2008 | Feng ....................... H01L 24/11 257/777 |

FOREIGN PATENT DOCUMENTS

CN        101118895 A  *  2/2008   ......... H01L 23/4334

* cited by examiner

*Primary Examiner* — Niki H Nguyen
(74) *Attorney, Agent, or Firm* — JCIPRNET

(57) ABSTRACT

A circuit structure including a pad assembly, a bonding pad assembly, and a bonding assembly is provided. The pad assembly includes a first pad, a second pad, and a third pad which are separated from one another. The bonding pad assembly is located on one side of the pad assembly and includes a first bonding pad. The bonding assembly includes a first bonding wire, a second bonding wire, and a plurality of bonding members. The first bonding wire is connected to the first bonding pad and the first pad. The second bonding wire is connected to the first bonding pad and the third pad. The bonding members are connected among the first pad, the second pad, and the third pad. The circuit structure provided here may have an improved wire bonding efficiency and an increased distribution density of bonding points, and the number of bonding wires may be reduced.

7 Claims, 4 Drawing Sheets

(51) Int. Cl.
*H01L 23/52* (2006.01)
*H01L 29/40* (2006.01)
*H05K 1/11* (2006.01)

(52) U.S. Cl.
CPC .............. *H01L 2224/0603* (2013.01); *H01L 2224/06132* (2013.01); *H01L 2224/4903* (2013.01); *H01L 2224/4911* (2013.01); *H01L 2224/49175* (2013.01); *H01L 2224/49421* (2013.01); *H01L 2924/01029* (2013.01); *H01L 2924/01079* (2013.01); *H05K 2201/094* (2013.01)

(58) Field of Classification Search
CPC . H01L 2224/45144; H01L 2924/01033; H01L 2924/00; H01L 2924/14; H01L 2924/01006; H01L 24/73; H01L 2224/32225; H01L 24/45; H01L 2924/014; H01L 2924/01013; H01L 2924/01082; H01L 2924/15311; H01L 2224/48137; H01L 33/62; H01L 2224/05554; H01L 2924/01078; H01L 2224/04042; H01L 2224/32245; H01L 24/16; H01L 2924/01047; H01L 2924/01014; H01L 2224/16225; H01L 24/32; H01L 2224/49171; H01L 2224/0401; H01L 2924/00012; H01L 25/0657; H01L 2924/01015; H01L 2224/48465; H01L 2224/45124; H01L 25/0655; H01L 25/0753; H01L 25/18; H01L 2224/45015; H01L 2924/3011
See application file for complete search history.

CIRCUIT STRUCTURE

CROSS-REFERENCE TO RELATED APPLICATION

This application claims the priority benefit of China patent application serial no. 202011173690.2, filed on Oct. 28, 2020. The entirety of the above-mentioned patent application is hereby incorporated by reference herein and made a part of this specification.

BACKGROUND

Technical Field

The disclosure relates to a circuit structure; more particularly, the disclosure relates to a circuit structure capable of improving wire bonding efficiency.

Description of Related Art

Generally, the existing wire bonding method of an integrated circuit is to connect each pad on a chip and a common bonding pad on a circuit board through wire bonding. In other words, each bonding wire is connected to one pad and one common bonding pad. Such a method not only requires a significant number of bonding wires but also reduces a wire bonding efficiency due to the long wire bonding distance. In addition, each pad to be directly connected to the common bonding pad requires a corresponding bonding wire, and therefore the number of bonding wires in a unit space may be considerable, which may lead to insufficient space utilization rate of bonding points of the integrated circuit and pose a negative impact on the miniaturization of the integrated circuit module.

SUMMARY

The disclosure is directed to a circuit structure which may improve a wire bonding efficiency and increase a distribution density of bonding points while the number of required bonding wires may be reduced.

According to an embodiment of the disclosure, a circuit structure including a pad assembly, a bonding pad assembly, and a bonding assembly is provided. The pad assembly includes a first pad, a second pad, and a third pad that are separated from one another. The bonding pad assembly is located at one side of the pad assembly and includes a first bonding pad. The bonding assembly includes a first bonding wire, a second bonding wire, and a plurality of bonding members. The first bonding wire is connected to the first bonding pad and the first pad. The second bonding wire is connected to the first bonding pad and the third pad. The bonding members are connected among the first pad, the second pad, and the third pad.

In an embodiment of the disclosure, the circuit structure includes a chip and a circuit board, the chip includes the pad assembly, and the circuit board includes the bonding pad assembly.

In an embodiment of the disclosure, a pitch between the first pad and the second pad and a pitch between the second pad and the third pad are both greater than 100 μm.

In an embodiment of the disclosure, the bonding members include a third bonding wire and a fourth bonding wire. The third bonding wire is connected to the first bonding wire on the first pad and connected to the second pad. The fourth bonding wire is connected to the third bonding wire on the second pad and connected to the second bonding wire on the third pad.

In an embodiment of the disclosure, the pad assembly further includes a fourth pad located between the second pad and the third pad, and a pitch between the second pad and the fourth pad is less than 100 μm.

In an embodiment of the disclosure, the bonding members include a third bonding wire, a fourth bonding wire, and a metal ball. The third bonding wire is connected to the first bonding wire on the first pad and connected to the second pad. The metal ball is connected to the third bonding wire on the second pad and connected to the fourth pad. The fourth bonding wire is connected to the metal ball on the fourth pad and the second bonding wire on the third pad.

In an embodiment of the disclosure, the metal ball includes a gold ball or a copper ball.

In an embodiment of the disclosure, the pad assembly further includes a fifth pad located between the first pad and the second pad. The bonding members further include a fifth bonding wire, and the bonding pad assembly further includes a second bonding pad. The fifth bonding wire is connected to the fifth pad and the second bonding pad.

In an embodiment of the disclosure, an orthographic projection of the third bonding wire on the fifth pad does not overlap the fifth pad.

In an embodiment of the disclosure, a size of the first bonding pad is larger than a size of the second bonding pad.

In view of the above, in the circuit structure provided in one or more embodiments of the disclosure, the bonding members of the bonding assembly may be connected among the first pad, the second pad, and the third pad. Therefore, compared to the related art that requires the bonding wire to be directly connected from each pad to the bonding pad, the circuit structure provided in one or more embodiments of the disclosure may improve the wire bonding efficiency and increase the distribution density of bonding points while the number of the required bonding wires is reduced.

To make the above more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
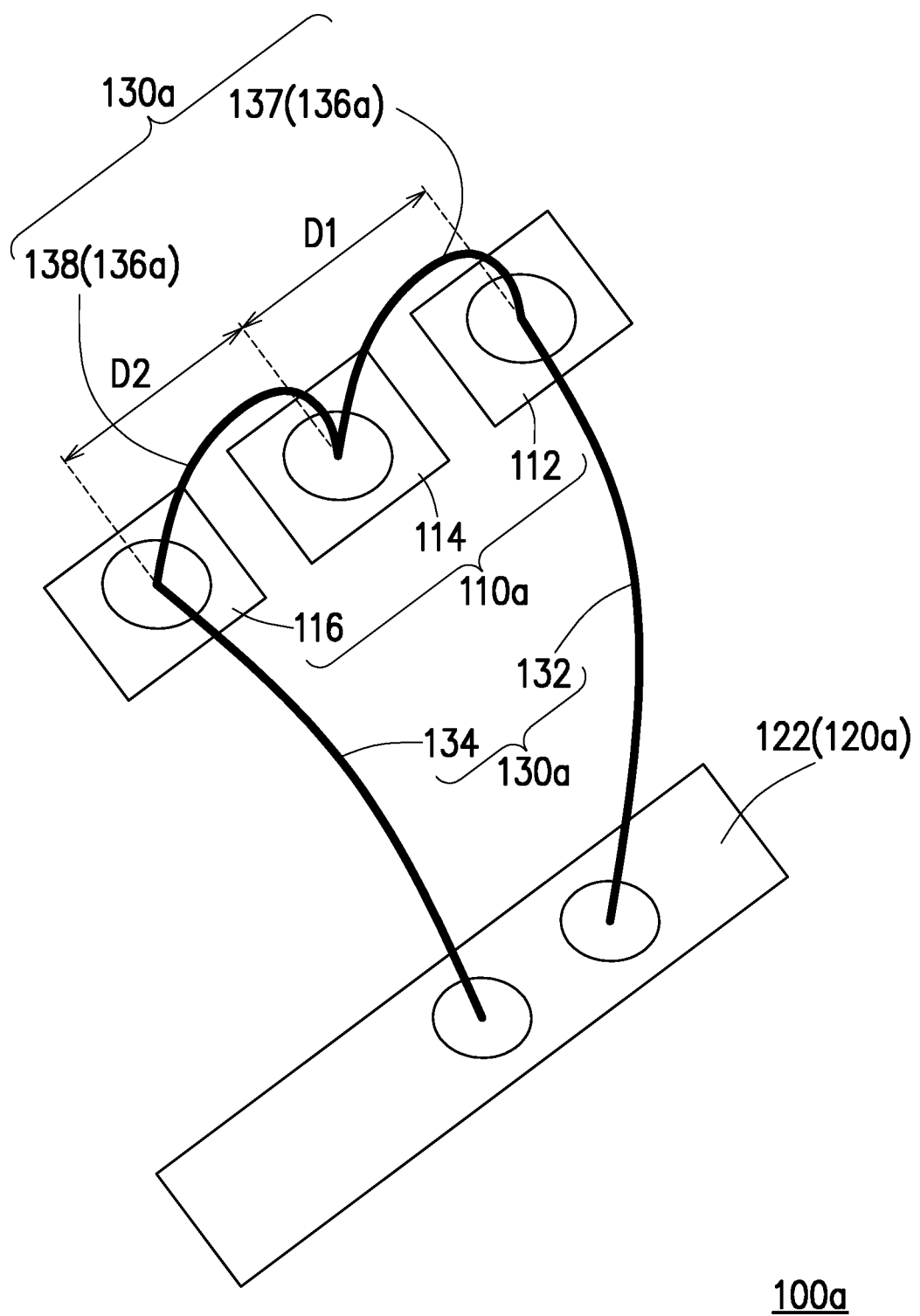
FIG. 1 is a schematic view of a circuit structure according to an embodiment of the disclosure.

Reference will now be made in detail to the present preferred embodiments of the disclosure, examples of which are illustrated in the accompanying drawings. Wherever possible, the same reference numbers are used in the drawings and the description to refer to the same or like parts.

FIG. 1 is a schematic view of a circuit structure according to an embodiment of the disclosure. With reference to FIG. 1, in the present embodiment, a circuit structure 100a includes a pad assembly 110a, a bonding pad assembly 120a, and a bonding assembly 130a. The pad assembly 110a includes a first pad 112, a second pad 114, and a third pad 116 that are separated from one another. The bonding pad assembly 120a is located at one side of the pad assembly 110a and includes a first bonding pad 122. The bonding assembly 130a includes a first bonding wire 132, a second bonding wire 134, and a plurality of bonding members 136a. The first bonding wire 132 is connected to the first bonding pad 122 and the first pad 112. The second bonding wire 134 is connected to the first bonding pad 122 and the third pad 116. The bonding members 136a are connected among the first pad 112, the second pad 114, and the third pad 116.

Specifically, the pad assembly 110a is, for instance, located on a peripheral surface of a chip, and the bonding assembly 130a is, for instance, located on an external circuit, such as a circuit board, which should however not be construed as a limitation in the disclosure. Besides, according to the present embodiment, a pitch D1 between the first pad 112 and the second pad 114 and a pitch D2 between the second pad 114 and the third pad 116 are both greater than 100 μm, wherein the pitch D1 and the pitch D2 may be the same or different, which should not be construed as a limitation in the disclosure. As shown in FIG. 1, the bonding members 136a provided in this embodiment includes a third bonding wire 137 and a fourth bonding wire 138. The third bonding wire 137 is connected to the first bonding wire 132 on the first pad 112 and connected to the second pad 114. The fourth bonding wire 138 is connected to the third bonding wire 137 on the second pad 114 and connected to the second bonding wire 134 on the third pad 116. That is, the first pad 112, the second pad 114, and the third pad 116 are electrically connected in series through the bonding members 136a. In other words, the second pad 114 provided in this embodiment is electrically connected to the first bonding pad 122 of the bonding pad assembly 120a through the bonding members 136a and the first bonding wire 132 or the bonding members 136a and the second bonding wire 134. Here, materials of the first bonding wire 132, the second bonding wire 134, the third bonding wire 137, and the fourth bonding wire 138 are, for instance, gold or copper.

As to the manufacturing process, as shown in FIG. 1, the pad assembly 110a and the bonding pad assembly 120a may be formed first. Next, a gold ball or a copper ball is implanted on the first pad 112, the second pad 114, the third pad 116, and the first bonding pad 122 that require bonding wires, and a first wire bonding process is performed, so that the first bonding wire 132 connects the first bonding pad 122 to the first pad 112. After the first wire bonding process is performed, a bonding process is performed, so that the bonding members 136a are connected among the first pad 112, the second pad 114, and the third pad 116. Particularly, the bonding process includes a third wire bonding process and a fourth wire bonding process. After the first wire bonding process is performed, the third wire bonding process is performed, so that the third bonding wire 137 is connected to the first bonding wire 132 on the first pad 112 and connected to the second pad 114. After the third wire bonding process is performed, the fourth bonding process is performed, so that the fourth bonding wire 138 is connected to the third bonding wire 137 on the second pad 114 and connected to the third pad 116. After the bonding process is performed, a second wire bonding process is performed, so that the second bonding wire 134 is connected to the first bonding pad 122 and connected to the fourth bonding wire 138 on the third pad 116. So far, the circuit structure 100a is completely formed.

In short, compared to the related art that requires the bonding wire to be directly connected from each pad to the bonding pad, in this embodiment, the first pad 112, the second pad 114, and the third pad 116 of the pad assembly 110a may be connected in series through the bonding members 136a, whereby the wire bonding distance may be reduced. As a result, the wire bonding efficiency may be improved, and the number of the required bonding wires may be reduced. In addition, because each pad is not required to be directly connected to the first bonding pad through wire bonding, the number of bonding wires distributed in a unit space is not considerable, so as to increase the distribution density of the bonding points, which is conducive to miniaturization. Preferably, the circuit structure 100a provided in this embodiment may be applied to a camera module with a chip on board (COB) package or applied to an integrated circuit product that requires the bonding process.

Note that the reference numbers and part of the content of the foregoing embodiments are applied in the following embodiments, the same reference numbers serve to represent the same or similar elements, and the description of the same technical content is omitted. For the description of the omitted content, reference may be made to the foregoing embodiments, and no repetitive explanation will be provided in the following embodiments.

Figure 2:
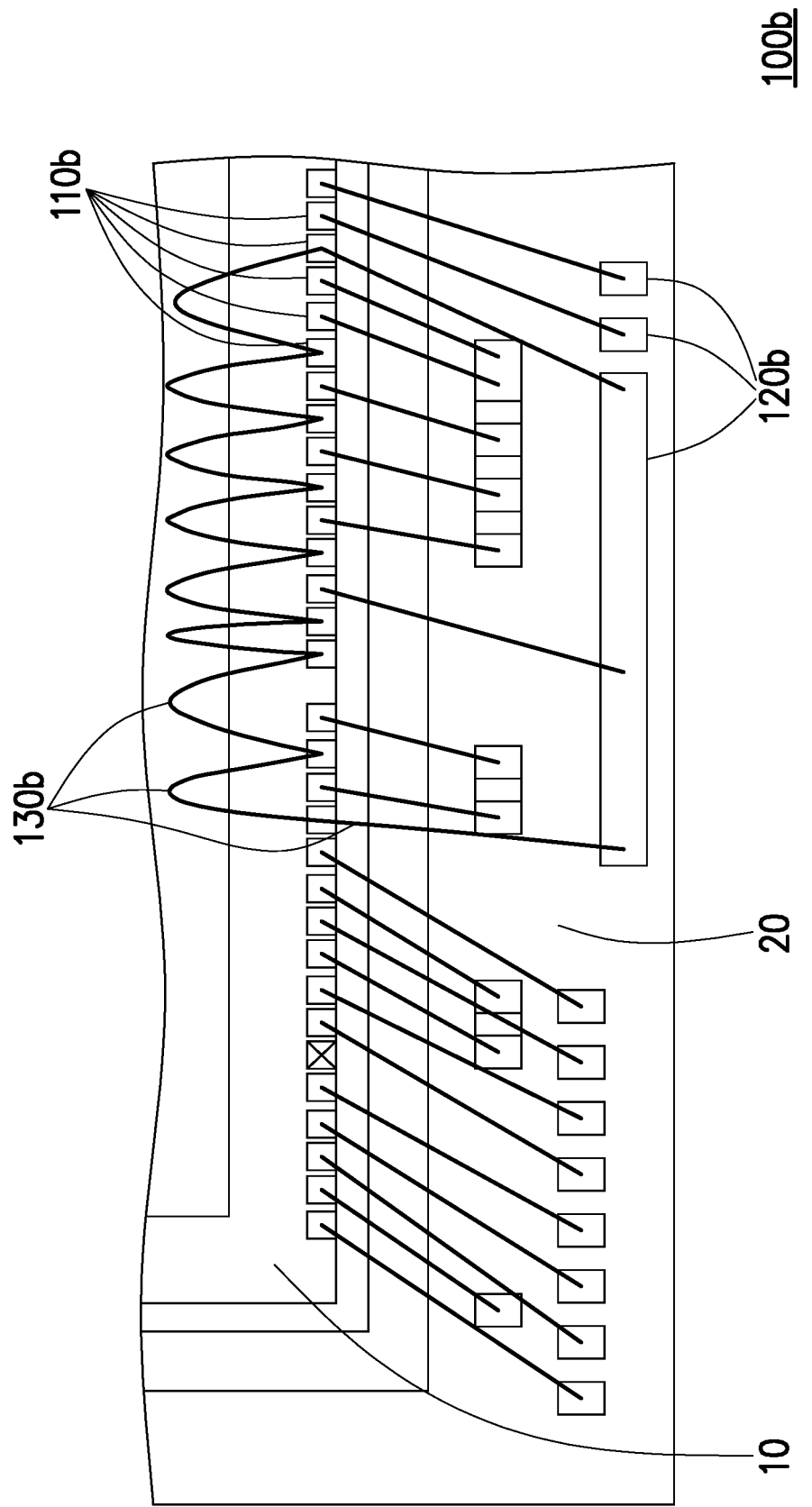
FIG. 2 is a schematic view of a circuit structure according to another embodiment of the disclosure.

FIG. 2 is a schematic view of a circuit structure according to another embodiment of the disclosure. With reference to FIG. 1 and FIG. 2, a circuit structure 100b provided in this embodiment is similar to the circuit structure 100a depicted in FIG. 1, while the difference therebetween lies in that the chip 10 in the circuit structure 100b provided in this embodiment includes a pad assembly 110b, and the circuit board 20 includes a bonding pad assembly 120b. Here, the pad assembly 110b is electrically connected to the bonding pad assembly 120b through the bonding assembly 130b.

Figure 3:
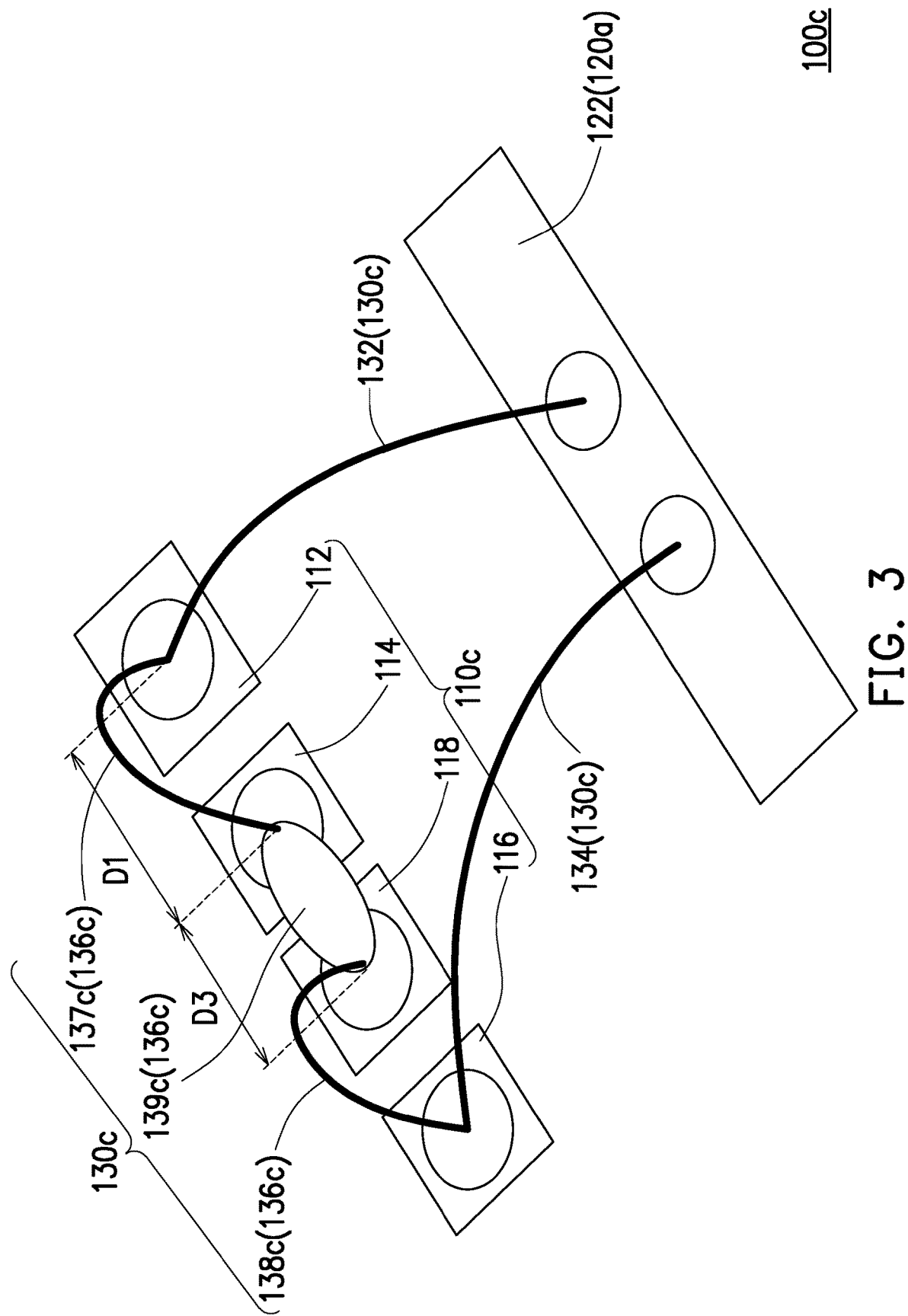
FIG. 3 is a schematic view of a circuit structure according to another embodiment of the disclosure.

FIG. 3 is a schematic view of a circuit structure according to another embodiment of the disclosure. With reference to FIG. 1 and FIG. 3, a circuit structure 100c provided in this embodiment is similar to the circuit structure 100a depicted in FIG. 1, while the difference therebetween lies in that a pad assembly 110c of the circuit structure 100c provided in this embodiment further includes a fourth pad 118 located between the second pad 114 and the third pad 116, wherein a pitch D3 between the second pad 114 and the fourth pad 118 is less than 100 μm. In other words, the pitch D1 between the first pad 112 and the second pad 114 provided in this embodiment is greater than the pitch D3 between the second pad 114 and the fourth pad 118.

As shown in FIG. 3, in the present embodiment, the bonding members 136c of the bonding assembly 130c include a third bonding wire 137c, a fourth bonding wire 138c, and a metal ball 139c. The third bonding wire 137c is connected to the first bonding wire 132 on the first pad 112 and connected to the second pad 114. The metal ball 139c is connected to the third bonding wire 137c on the second pad 114 and connected to the fourth pad 118. The fourth bonding wire 138c is connected to the metal ball 139c on the fourth pad 118 and connected to the second bonding wire 134 on the third pad 116. Here, the metal ball 139c is, for instance, a gold ball or a copper ball.

As to the manufacturing process, as shown in FIG. 3, the pad assembly 110c and the bonding pad assembly 120a may be formed first. Next, a gold or copper ball is implanted on the first pad 112, the second pad 114, the third pad 116, the fourth pad 118, and the first bonding pad 122 that require bonding wires, and a first wire bonding process is performed, so that the first bonding wire 132 connects the first bonding pad 122 to the first pad 112. After the first wire bonding process is performed, a bonding process is performed, so that the bonding members 136c are connected among the first pad 112, the second pad 114, the third pad 116, and the fourth pad 118. Particularly, the bonding process includes a third wire bonding process, a ball implantation process, and a fourth wire bonding process. After the first wire bonding process is performed, the third wire bonding process is performed, so that the third bonding wire 137c is connected to the first bonding wire 132 on the first pad 112 and connected to the second pad 114. The ball implantation process is then performed, so that the metal ball 139c is connected to the third bonding wire 137c on the second pad 114 and connected to the fourth pad 118. After that, the fourth wire bonding process is performed, so that the fourth bonding wire 138c is connected to the metal ball 139c on the fourth pad 118 and connected to the third pad 116. After the bonding process is performed, a second wire bonding process is performed, so that the second bonding wire 134 is connected to the first bonding pad 122 and connected to the fourth bonding wire 138c on the third pad 116. So far, the circuit structure 100c is completely formed.

In short, since the pitch D3 between the second pad 114 and the fourth pad 118 provided in this embodiment is less than 100 μm, the metal ball 139c serves to replace the bonding wires as the bonding members 136c between the second pad 114 and the fourth pad 118. That is, the second pad 114 and the fourth pad 118 are directly electrically connected through the metal ball 139c. As such, the number of the required bonding wires may be reduced, and the wire bonding efficiency may be improved. In addition, because each pad is not required to be directly connected to the first bonding pad 122 through wire bonding, the number of bonding wires distributed in a unit space is not considerable, so as to increase the distribution density of the bonding points, which is conducive to miniaturization.

Figure 4:
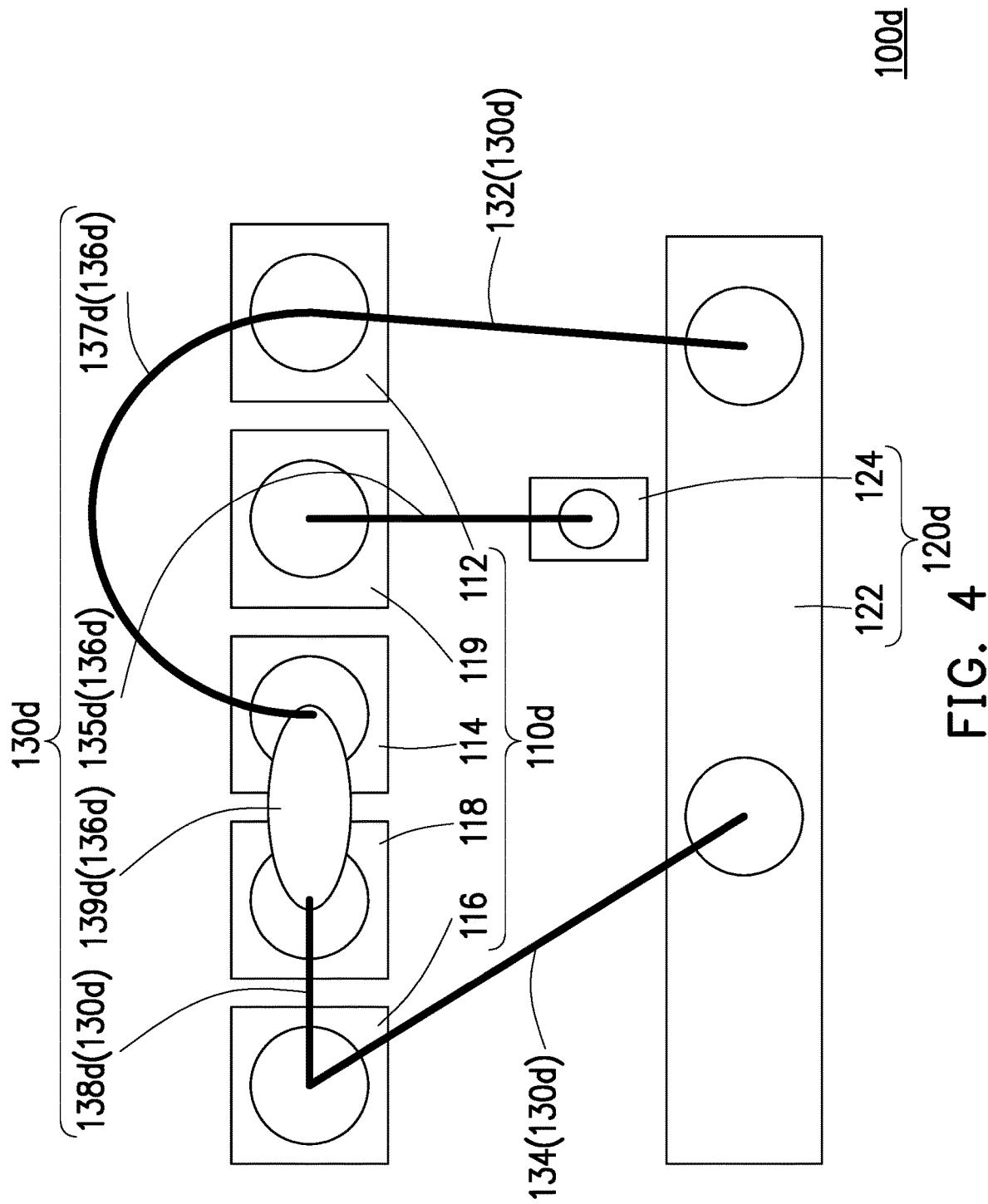
FIG. 4 is a schematic view of a circuit structure according to another embodiment of the disclosure.

FIG. 4 is a schematic view of a circuit structure according to another embodiment of the disclosure. For better illustration, the circuit structure depicted in FIG. 4 is a front view. With reference to FIG. 3 and FIG. 4, a circuit structure 100d provided in this embodiment is similar to the circuit structure 100c depicted in FIG. 3, while the difference therebetween lies in that a pad assembly 110d provided in the present embodiment further includes a fifth pad 119 located between the first pad 112 and the second pad 114. Furthermore, bonding members 136d of the bonding assembly 130d provided in this embodiment further include a fifth bonding wire 135d, and a bonding pad assembly 120d further includes the second bonding pad 124, wherein the fifth bonding wire 135d is connected to the fifth pad 119 and the second bonding pad 124.

In detail, the bonding members 136d provided in this embodiment include a third bonding wire 137d, a fourth bonding wire 138d, a metal ball 139d, and the fifth bonding wire 135d. The third bonding wire 137d is connected to the first bonding wire 132 on the first pad 112 and connected to the second pad 114. In particular, an orthographic projection of the third bonding wire 137d on the fifth pad 119 does not overlap the fifth pad 119. In other words, the third bonding wire 137d is not routed directly above the fifth pad 119 but is connected to the second pad 114 by bypassing a side edge of the fifth pad 119, thereby avoiding the risk of short circuit resulting from the contact with the fifth bonding wire 135d on the fifth pad 119. The metal ball 139c is connected to the third bonding wire 137d on the second pad 114 and connected to the fourth pad 118. The fourth bonding wire 138d is connected to the metal ball 139d on the fourth pad 118 and the second bonding wire 134 on the third pad 116. Here, the metal ball 139c is, for instance, a gold ball or a copper ball, and a size of the first bonding pad 122 is larger than a size of the second bonding pad 124.

To sum up, in the circuit structure provided in one or more embodiments of the disclosure, the bonding members of the bonding assembly may be connected among the first pad, the second pad, and the third pad. Therefore, compared to the related art that requires the bonding wire to be directly connected from each pad to the bonding pad, the circuit structure provided in one or more embodiments of the disclosure may improve the wire bonding efficiency and increase the distribution density of bonding points while the number of the required bonding wires is reduced.

It will be apparent to those skilled in the art that various modifications and variations can be made to the disclosed embodiments without departing from the scope or spirit of the disclosure. In view of the foregoing, it is intended that the disclosure covers modifications and variations provided they fall within the scope of the following claims and their equivalents.

What is claimed is:

1. A circuit structure, comprising:
 a pad assembly, comprising a first pad, a second pad, and a third pad separated from one another;
 a bonding pad assembly, located at one side of the pad assembly and comprising a first bonding pad; and
 a bonding assembly, comprising a first bonding wire, a second bonding wire, and a plurality of bonding members, wherein the first bonding wire is connected to the first bonding pad and the first pad, the second bonding wire is connected to the first bonding pad and the third pad, and the bonding members are connected among the first pad, the second pad, and the third pad, wherein a pitch between the first pad and the second pad and a pitch between the second pad and the third pad are both greater than 100 μm;
 wherein the bonding members comprise a third bonding wire and a fourth bonding wire, the third bonding wire is connected to the first bonding wire on the first pad and connected to the second pad, and the fourth bonding wire is connected to the third bonding wire on the second pad and the second bonding wire on the third pad.

2. The circuit structure according to claim 1, further comprising a chip and a circuit board, wherein the chip comprises the pad assembly, and the circuit board comprises the bonding pad assembly.

3. A circuit structure, comprising:
 a pad assembly, comprising a first pad, a second pad, and a third pad separated from one another;
 a bonding pad assembly, located at one side of the pad assembly and comprising a first bonding pad; and
 a bonding assembly, comprising a first bonding wire, a second bonding wire, and a plurality of bonding members, wherein the first bonding wire is connected to the first bonding pad and the first pad, the second bonding wire is connected to the first bonding pad and the third pad, and the bonding members are connected among the first pad, the second pad, and the third pad;

wherein the pad assembly further comprises a fourth pad located between the second pad and the third pad, and a pitch between the second pad and the fourth pad is less than 100 μm;

wherein the bonding members comprise a third bonding wire, a fourth bonding wire, and a metal ball, the third bonding wire is connected to the first bonding wire on the first pad and connected to the second pad, the metal ball is connected to the third bonding wire on the second pad and connected to the fourth pad, and the fourth bonding wire is connected to the metal ball on the fourth pad and the second bonding wire on the third pad.

4. The circuit structure according to claim 3, wherein the metal ball comprises a gold ball or a copper ball.

5. The circuit structure according to claim 3, wherein the pad assembly further comprises a fifth pad located between the first pad and the second pad, the bonding members further comprise a fifth bonding wire, the bonding pad assembly further comprises a second bonding pad, and the fifth bonding wire is connected to the fifth pad and the second bonding pad.

6. The circuit structure according to claim 5, wherein an orthographic projection of the third bonding wire on the fifth pad does not overlap the fifth pad.

7. The circuit structure according to claim 5, wherein a size of the first bonding pad is larger than a size of the second bonding pad.

\* \* \* \* \*